United States Patent
Shealy et al.

(10) Patent No.: US 12,068,161 B1
(45) Date of Patent: Aug. 20, 2024

(54) METHOD FOR IMPLANT AND ANNEAL FOR HIGH VOLTAGE FIELD EFFECT TRANSISTORS

(71) Applicant: POWER INTEGRATIONS, INC., San Jose, CA (US)

(72) Inventors: James R. Shealy, Ithaca, NY (US); Richard J. Brown, Ithaca, NY (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 18/045,071

(22) Filed: Oct. 7, 2022

Related U.S. Application Data

(60) Provisional application No. 63/293,069, filed on Dec. 22, 2021.

(51) Int. Cl.
*H01L 21/00* (2006.01)
*H01L 21/265* (2006.01)
*H01L 29/04* (2006.01)
*H01L 29/66* (2006.01)

(52) U.S. Cl.
CPC ........ *H01L 21/26553* (2013.01); *H01L 29/04* (2013.01); *H01L 29/66204* (2013.01)

(58) Field of Classification Search
CPC .............. H01L 21/26553; H01L 29/04; H01L 29/66204; H01L 29/6609; H01L 29/861
See application file for complete search history.

(56) References Cited

U.S. PATENT DOCUMENTS

2017/0372905 A1\* 12/2017 Takashima ........ H01L 29/66666

OTHER PUBLICATIONS

"Vicinity." Merriam-Webster.com. 2023. https://www.merriam-webster.com/dictionary/vicinity (Aug. 25, 2023). (Year: 2023).\*

\* cited by examiner

*Primary Examiner* — Reema Patel

(57) ABSTRACT

In an example, the present invention provides a method of forming a semiconductor device on a gallium and nitrogen containing material. The method includes providing a substrate member comprising a surface region, the substrate member comprising a gallium and nitrogen bearing material. The method includes causing an implanted species to electrically activate the implant profile while removing one or more crystalline damage from the epitaxial material to change the amorphous state to a single crystalline state, and thereby creating a substantially electrically activated crystalline material.

9 Claims, 6 Drawing Sheets

METHOD FOR IMPLANT AND ANNEAL FOR HIGH VOLTAGE FIELD EFFECT TRANSISTORS

CROSS-REFERENCE TO RELATED APPLICATION

The present application claims the benefit of priority of U.S. Provisional Application No. 63/293,069, filed Dec. 22, 2021, which is incorporated herein in its entirety.

This invention was made with government support under DE-AR0000870 awarded by U.S. Department of Energy, Advanced Research Projects Agency-Energy (ARPA-E). The government has certain rights in the invention.

BACKGROUND OF INVENTION

The present invention provides techniques for a high voltage field effect transistor ("FET") configured on a gallium and nitrogen containing material. In an example, the present invention includes a method and resulting structure for a FET configured in a region of gallium and nitrogen containing material, such as GaN or AlGaN. Merely by way of example, the invention has been applied to a high voltage FET device. However, the techniques can be applied other types of device structures and applications.

High voltage switching devices have revolutionized the world. High voltage switches devices are used in all power converters such as those in modern day electric cars, such as the Model S manufactured by Tesla, Inc. Traditional horizontal high voltage device approaches are limited to 600 to 900 Volts. Such horizontal high voltage device approaches are limited by the introduction of defects generated by lattice mismatch of semiconductor materials. The lattice mismatch leads to problems in quality, reliability, and limitations in voltage capability. Other high voltage device approaches such as those grown on bulk crystalline devices are improved. Although many advances occurred in the field of high voltage switching devices, and their processing, various limitations still exist.

From the above, it is seen that techniques for improving electronic devices are highly desirable.

BRIEF SUMMARY OF INVENTION

According to the present invention, techniques for a high voltage field effect transistor ("FET") configured on a gallium and nitrogen containing material are provided. In an example, the present invention includes a method and resulting structure for a FET configured in a region of gallium and nitrogen containing material, such as GaN or AlGaN. Merely by way of example, the invention has been applied to a high voltage FET device. However, the techniques can be applied other types of device structures and applications.

In an example, the present invention provides a method of forming a semiconductor device on a gallium and nitrogen containing material. The method includes providing a substrate member comprising a surface region, the substrate member comprising a gallium and nitrogen bearing material, the surface region being configured along a c-plane having an off-set cut along a direction of an m-plane. The method includes forming a thickness of epitaxial material comprising a gallium and nitrogen bearing material, using a MOCVD or HVPE overlying the surface region, the thickness of epitaxial material having an upper surface region to cause growth of the epitaxial material having a silicon dopant concentration of 1E15 to 5E16 atoms/centimeter cubed, and the thickness ranging from 1 micron to 3 micron or 50 microns to 60 microns, and a surface. The method includes subjecting the upper surface region of the thickness of epitaxial material to a cleaning solution using a combination of a solvent mixture and an acid containing mixture and forming a barrier material overlying the upper surface region, the barrier material having a thickness to adjust an implant profile of an implant. The method includes subjecting the barrier material to a plurality of particles to implant the plurality of particles through the barrier material to a predetermined depth as measured from the upper surface region such that the plurality of particles forms the implant profile within a vicinity of the predetermined depth and having a peak within a vicinity of the upper surface of the thickness of epitaxial material such that the implant causing crystalline damage to a portion of the epitaxial material to cause the epitaxial material to become amorphous in state. The method includes removing the barrier material using an etching process to expose the upper surface region and subjecting the substrate material, epitaxial material, and implant profile to thermal energy to anneal the epitaxial material including the implant profile at a temperature of 700 to 1500° C. using an ammonia containing environment for a time period of 1 to 3000 seconds to cause a hydrogen containing environment to create atomic hydrogen to interact with the plurality of particles; and thereafter removing the hydrogen containing environment using a nitrogen containing environment to drive out hydrogen species from the epitaxial material including the implant profile. The method includes causing the implanted species to electrically activate the implant profile while removing one or more crystalline damage from the epitaxial material to change the amorphous state to a single crystalline state, and thereby creating a substantially electrically activated crystalline material.

One or more benefits are achieved over pre-existing techniques using the invention. In particular, the invention enables a cost-effective technique for providing improved electrical characteristics of a gallium and nitrogen containing material. In an example, the technique uses a beryllium species configured with implantation techniques into a crystalline gallium and nitrogen containing material to form a low resistivity material for switching devices, among others. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline or can be other configurations. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE EMBODIMENTS

According to the present invention, techniques for a high voltage field effect transistor ("FET") configured on a gallium and nitrogen containing material are provided. In an example, the present invention includes a method and resulting structure for a FET configured in a region of gallium and nitrogen containing material, such as GaN or AlGaN. Merely by way of example, the invention has been applied to a high voltage FET device. However, the techniques can be applied other types of device structures and applications.

Figure 1:
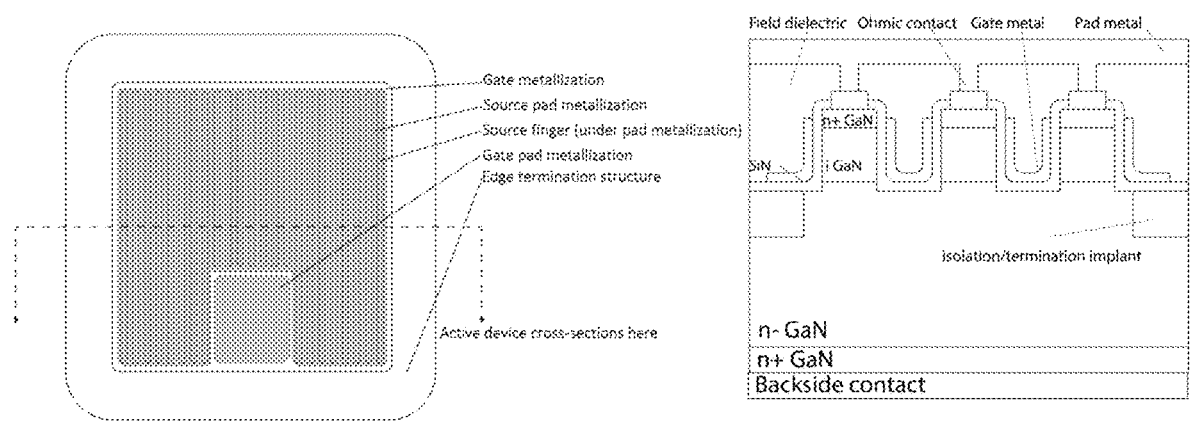
FIG. 1 is a simplified diagram of a vertical FET device configured on a GaN substrate according to an example of the present invention.

FIG. 1 is a simplified diagram of a vertical FET device (top view and cross-sectional views) configured on a GaN substrate according to an example of the present invention. As shown is a plan view of the device die (left), and cross section at indicated position (right).

Figure 2:
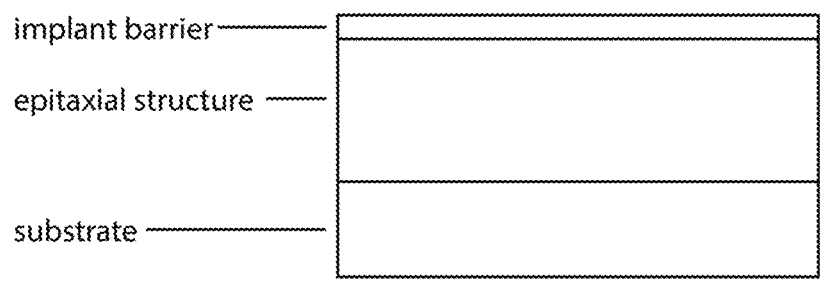
FIGS. 2 to 4 illustrate a method of fabricating the vertical FET device using a barrier material according to an example of the present invention.
Figure 3:
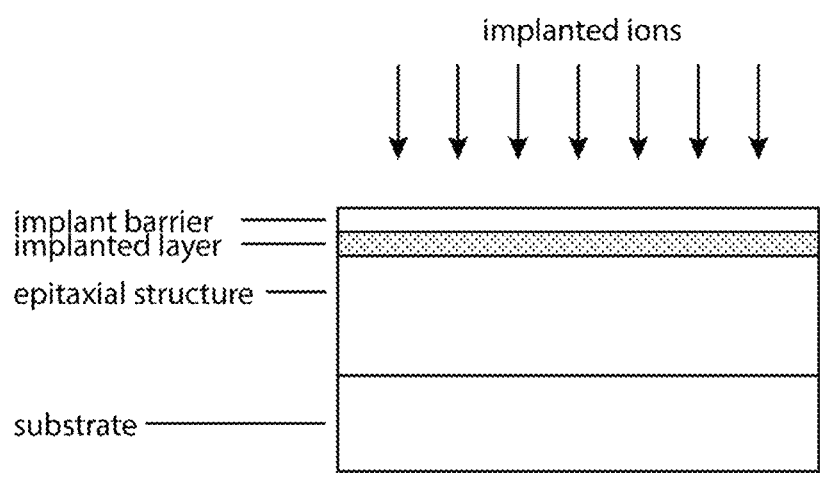
Figure 4:
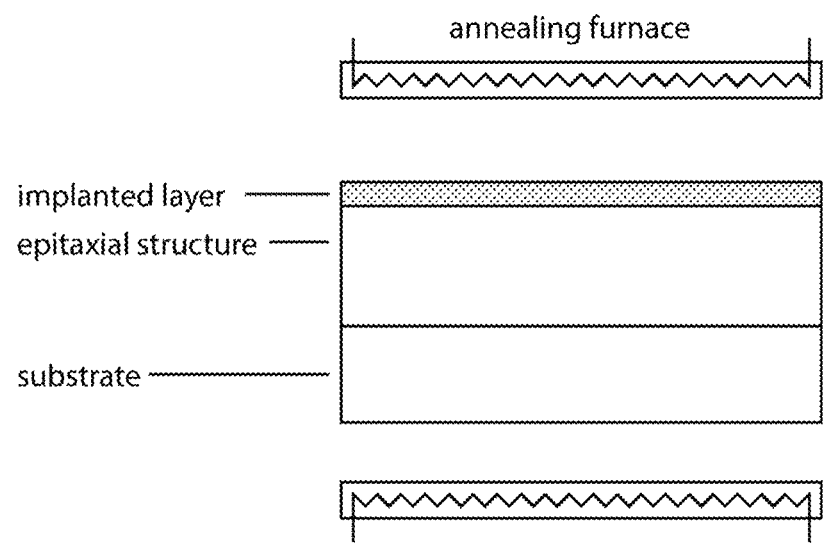

FIGS. 2 to 4 illustrate a method of fabricating the vertical FET device using a barrier material according to an example of the present invention. These diagrams are merely examples, and should not unduly limit the scope of the claims. One of ordinary skill in the art would recognize other variations, alternatives, and modifications. In an example, the method can be described according to the following steps:

1.) Starting structure: epi on substrate (epi typically GaN, substrate can be anything), with a layer applied to act as a partial barrier to the ion implant, as shown in FIG. 2.

2.) Implant ions into GaN: Mg, Be, and/or other species, as shown in FIG. 3.

3.) Strip implant barrier with wet or dry etch. Perform anneal in conventional furnace below the decomposition point of GaN in an ammonia ($NH_3$) ambient, followed by an anneal in $N_2$ ambient to drive out the hydrogen from the previous step, as shown in FIG. 4.

Figure 5:
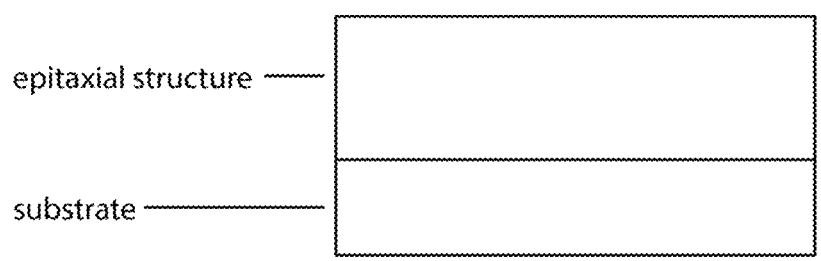
FIGS. 5 to 7 illustrate a method of fabricating the vertical FET device without using a barrier material according to an example of the present invention.
Figure 6:
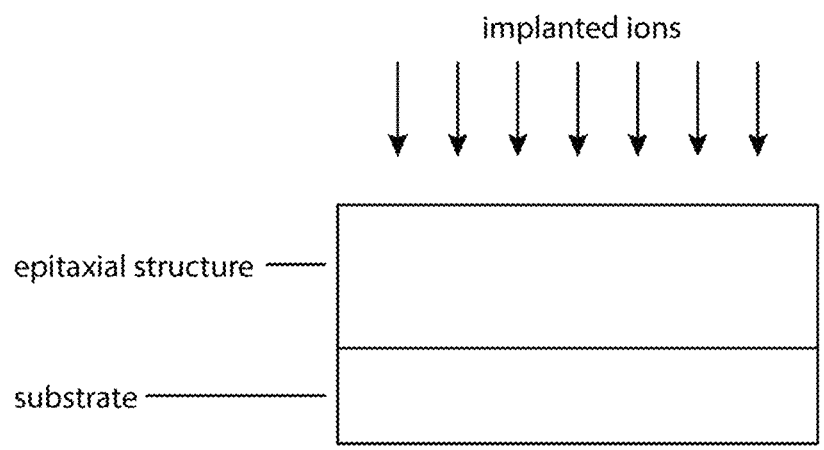
Figure 7:
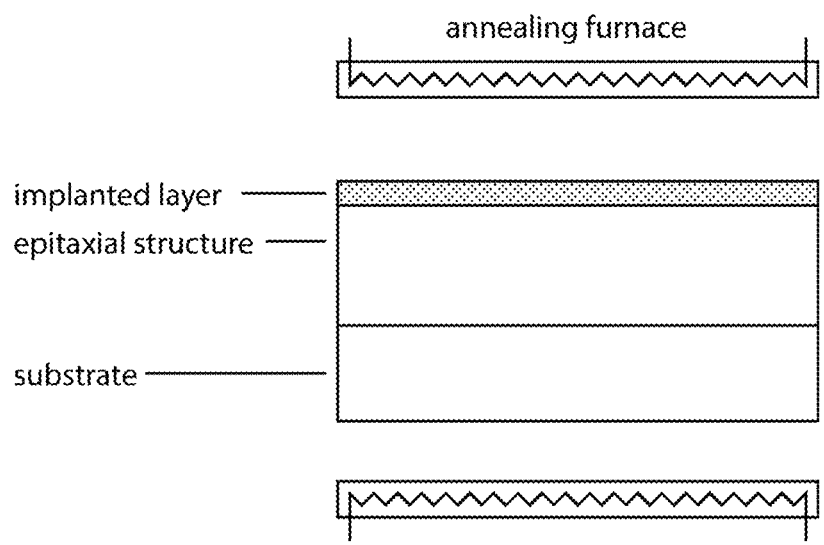

FIGS. 5 to 7 illustrate a method of fabricating the vertical FET device without using a barrier material according to an example of the present invention. As shown below, the method can be described as an example.

1.) Starting structure: epi on substrate (epi typically GaN, substrate can be anything suitable), as shown in FIG. 5.

2.) Implant ions into GaN: Mg, Be, and/or other species, as shown in FIG. 6.

3.) Perform anneal in conventional furnace below the decomposition point of GaN in an ammonia ($NH_3$) ambient, followed by an anneal in $N_2$ ambient to drive out the hydrogen from the previous step, as shown in FIG. 7.

Implant, Barrier, and Anneal Process Details
(Patterned Implant with Implant Barrier)

Figure 8:
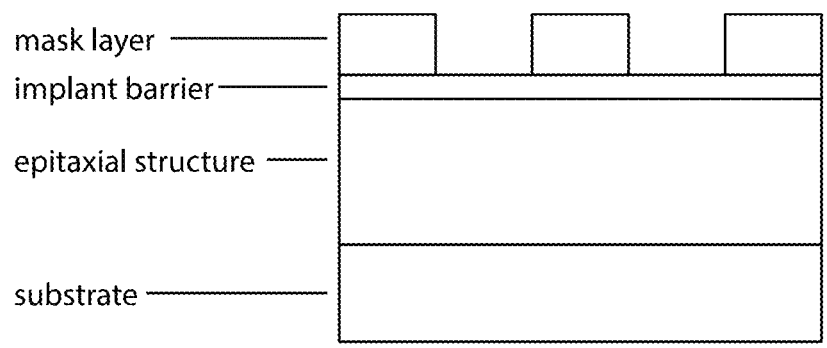
FIGS. 8 to 10 illustrate a method of fabricating the vertical FET device without using a patterned implant and barrier material according to an example of the present invention.
Figure 9:
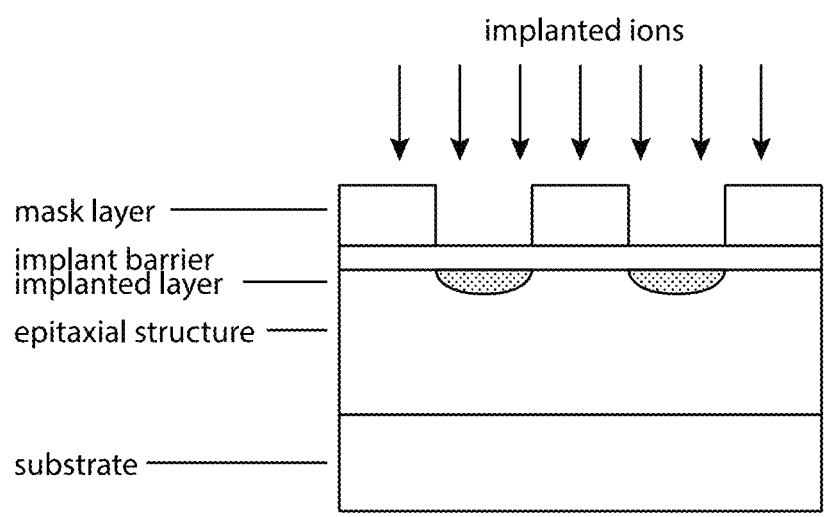
Figure 10:
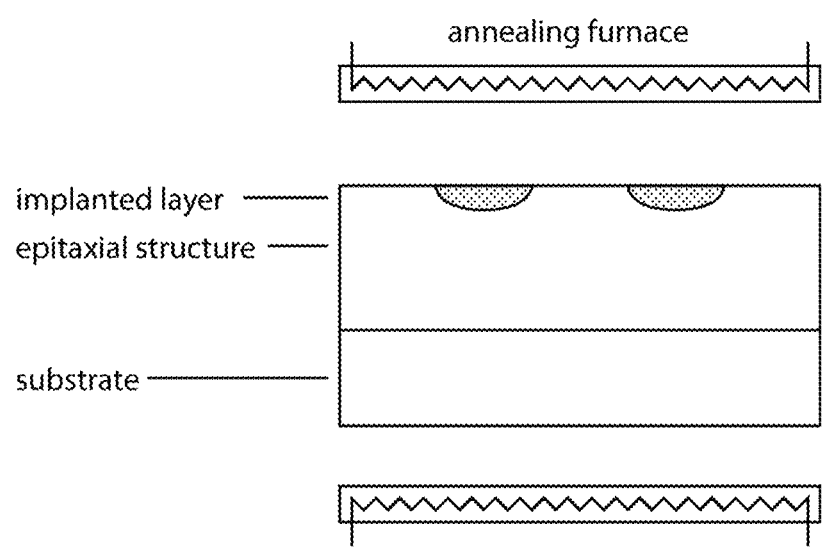

FIGS. 8 to 10 illustrate a method of fabricating the vertical FET device without using a patterned implant and barrier material according to an example of the present invention. The method can be described below:

1.) Starting structure: epi on substrate (epi typically GaN, substrate can be anything) with an implantation barrier on top to place the maxima of the implant density at the surface of the epitaxial layer, as shown in FIG. 8. The mask layer prevents any implanted ions from entering either the implant barrier or the epitaxial structure.

2.) Implant ions into GaN: Mg, Be, and/or other species. through implant mask and implant barrier, as shown in FIG. 9.

3.) Remove mask layer and implant barrier by wet chemical or reactive ion etch (RIE). Perform anneal in conventional furnace below the decomposition point of GaN in an ammonia ($NH_3$) ambient, as shown in FIG. 10.

The above sequence of steps is used to form high voltage FET devices on a die from a substrate structure according to one or more embodiments of the present invention. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below.

In an example, the present invention provides a method of forming a semiconductor device on a gallium and nitrogen containing material. The method includes providing a substrate member comprising a surface region, the substrate member comprising a gallium and nitrogen bearing material, the surface region being configured along a c-plane having an off-set cut along a direction of an m-plane and forming a thickness of epitaxial material comprising a gallium and nitrogen bearing material, using a MOCVD or HVPE overlying the surface region. In an example, the thickness of epitaxial material has an upper surface region to cause growth of the epitaxial material having a silicon dopant concentration of 1E15 to 5E16 atoms/centimeter cubed, and the thickness ranging from 1 micron to 3 micron or 50 microns to 60 microns, and a surface. In an example, the method includes subjecting the upper surface region of the thickness of epitaxial material to a cleaning solution using a combination of a solvent mixture and an acid containing mixture and forming a barrier material overlying the upper surface region, the barrier material having a thickness to adjust an implant profile of an implant. The method includes subjecting the barrier material to a plurality of particles to implant the plurality of particles through the barrier material to a predetermined depth as measured from the upper surface region such that the plurality of particles forms the implant profile within a vicinity of the predetermined depth and having a peak within a vicinity of the upper surface of the thickness of epitaxial material such that the implant causing crystalline damage to a portion of the epitaxial material to cause the epitaxial material to become amorphous in state. The method includes removing the barrier material using an etching process to expose the upper surface region and subjecting the substrate material, epitaxial material, and implant profile to thermal energy to anneal the epitaxial material including the implant profile at a temperature of 700 to 1500° C. using an ammonia containing environment for a time period of 1 to 3000 seconds to cause a hydrogen containing environment to create atomic hydrogen to interact with the plurality of particles; and thereafter removing the hydrogen containing environment using a nitrogen containing environment to drive out hydrogen species from the epitaxial material including the implant profile. The method causes the implanted species to electrically activate the implant profile while removing one or more crystalline damage from the epitaxial material to change the amorphous state to a single crystalline state, and thereby creating a substantially electrically activated crystalline material.

In an example, the method also includes variations. As an example, the MOCVD uses an ammonia gas, and a tri-methyl or tri ethyl gallium entity in an environment. The HVPE uses an ammonia gas and a gallium containing entity in an environment. In an example, the etching process comprises a wet etch or a dry etch. The barrier material comprises a material with sufficient density to attenuate the implanted ions to be able to obtain a high surface implant concentration. The thermal energy is provided by a global thermal process, rather than patterned, but can be patterned. In an example, the nitrogen containing environment is substantially free from any hydrogen species. In an example, the plurality of particles comprises a beryllium species or a magnesium species. In an example, the epitaxial material and the implant profile comprises an interface region characterized as a p-n junction to form a diode device. In an example, the epitaxial material and the implant profile comprises an interface region characterized as a p-n junction to form a diode device having predetermined electrical characteristic. In an example, the substrate member is selected from a silicon carbide substrate, a bulk gallium nitride substrate, and a silicon bearing substrate. Of course, there can be other variations, modifications, and alternatives.

In an alternative example, the present invention provides a method of forming a semiconductor device on a gallium and nitrogen containing material. The method includes providing a substrate member comprising a surface region. In an example, the substrate member comprises a gallium and nitrogen bearing material. The surface region IS configured along a c-plane having an off-set cut along a direction of an m-plane. In an example, the method includes forming a thickness of epitaxial material comprising a gallium and nitrogen bearing material, using a MOCVD or HVPE overlying the surface region, the thickness of epitaxial material having an upper surface region to cause growth of the epitaxial material having a silicon dopant concentration of 1E15 to 5E16 atoms/centimeter cubed, and the thickness ranging from 1 micron to 3 micron or 50 microns to 60 microns, and a surface roughness ranging having a predetermined range. In an example, the method includes subjecting the upper surface region of the thickness of epitaxial material to a cleaning solution using a combination of a solvent mixture and an acid containing mixture.

In an example, the method includes subjecting the upper surface region to a plurality of particles to implant the plurality of particles through the upper surface region to a predetermined depth as measured from the upper surface region such that the plurality of particles forms the implant profile within a vicinity of the predetermined depth and having a peak within a vicinity of a region below the upper surface of the thickness of epitaxial material such that the implant causing crystalline damage to a portion of the epitaxial material to cause the epitaxial material to become amorphous in state. The method includes subjecting the substrate material, epitaxial material, and implant profile to thermal energy to anneal the epitaxial material including the implant profile at a temperature of 700 to 1500° C. using an ammonia containing environment for a time period of 1 to 3000 seconds to cause a hydrogen containing environment to create atomic hydrogen to interact with the plurality of particles; and thereafter removing the hydrogen containing environment using a nitrogen containing environment to drive out hydrogen species from the epitaxial material including the implant profile. The method includes causing the implanted species to electrically activate the implant profile while removing one or more crystalline damage from the epitaxial material to change the amorphous state to a single crystalline state, and thereby creating a substantially electrically activated crystalline material and form a p-n junction between the implant profile and a remainder of the epitaxial material.

In an example, the method includes subjecting the upper surface to an etching process including a dry etching process and a wet etching process to adjust a characteristic of from a first state to a second state, where the first state characterized as a first current value and a second state characterized as a second current value, whereby the second current value is greater than the first current value.

In an example, the method has variations. In an example, the MOCVD uses an ammonia gas, and a tri-methyl or tri ethyl gallium entity in an environment and the HVPE uses an ammonia gas and a gallium containing entity in an environment. In an example, the thermal energy is provided by a global thermal process or patterned. In an example, the nitrogen containing environment is substantially free from any hydrogen species. In an example, the plurality of particles comprises a beryllium species or a magnesium species. In an example, the epitaxial material and the implant profile comprises an interface region characterized as a p-n junction to form a diode device. In an example, the epitaxial material and the implant profile comprises an interface region characterized as a p-n junction to form a diode device having predetermined electrical characteristic. Additionally, the substrate member is selected from a silicon carbide substrate, a bulk gallium nitride substrate, and a silicon bearing substrate. Of course, there can be other variations, modifications, and alternatives.

While the above is a full description of the specific embodiments, various modifications, alternative constructions and equivalents may be used. As an example, the implanted gallium and nitrogen containing region can include any combination of elements described above, as well as outside of the present specification. As used herein, the term "substrate" can mean the bulk substrate or can include overlying growth structures such as a gallium and nitrogen containing epitaxial region, or functional regions, combinations, and the like. Therefore, the above description and illustrations should not be taken as limiting the scope of the present invention which is defined by the appended claims.

The invention claimed is:

1. A method of forming a semiconductor device on a gallium and nitrogen containing material, the method comprising:

providing a substrate member comprising a surface region, the substrate member comprising a gallium and nitrogen bearing material, the surface region being configured along a c-plane having an off-set cut along a direction of an m-plane;

forming a thickness of epitaxial material comprising a gallium and nitrogen bearing material, using a MOCVD or HVPE process overlying the surface region, the thickness of epitaxial material having an upper surface region, the epitaxial material having a silicon dopant concentration of 1E15 to 5E16 atoms/ centimeter cubed, and the thickness ranging from 1 micron to 3 micron or 50 microns to 60 microns, and a surface roughness;

subjecting the upper surface region of the thickness of epitaxial material to a cleaning solution using a combination of a solvent mixture and an acid containing mixture;

subjecting the upper surface region to a plurality of particles to implant the plurality of particles through the upper surface region to a depth as measured from the upper surface region such that the plurality of particles forms the implant profile within the depth and having a peak within a region below the upper surface of the thickness of epitaxial material such that the implant causes crystalline damage to a portion of the epitaxial material to cause the epitaxial material to become amorphous in state;

subjecting the substrate member, the epitaxial material, and an implant profile to a thermal energy to anneal the epitaxial material including the implant profile at a temperature of 700 to 1500° C. using an ammonia containing environment for a time period of 1 to 3000 seconds to cause a hydrogen containing environment to create atomic hydrogen to interact with the plurality of particles; and thereafter removing the hydrogen containing environment using a nitrogen containing environment to drive out hydrogen species from the epitaxial material including the implant profile thereby removing a crystalline damage from the epitaxial material to change the amorphous state to a single crystalline state, and thereby creating an electrically activated crystalline material and form a p-n junction between the implant profile and a remainder of the epitaxial material; and subjecting the upper surface region to an etching process, the etching process is a dry etching process or a wet etching process, to adjust a characteristic of the upper surface region from a first state to a second state, the first state comprises a first current value and a second state comprises a second current value, whereby the second current value is greater than the first current value.

2. The method of claim 1 wherein the MOCVD process uses an ammonia gas, and a tri-methyl or tri ethyl gallium entity in an environment.

3. The method of claim 1 wherein the HVPE process uses an ammonia gas and a gallium containing entity in an environment.

4. The method of claim 1 wherein the thermal energy is provided by a thermal process.

5. The method of claim 1 wherein the nitrogen containing environment is free from any hydrogen species.

6. The method of claim 1 wherein the plurality of particles comprises a beryllium species or a magnesium species.

7. The method of claim 1 wherein the epitaxial material and the implant profile comprises an interface region characterized as a p-n junction to form a diode device.

8. The method of claim 1 wherein the epitaxial material and the implant profile comprises an interface region characterized as a p-n junction to form a diode device having an electrical characteristic.

9. The method of claim 1 wherein the substrate member is selected from the group of a silicon carbide substrate, a bulk gallium nitride substrate, and a silicon bearing substrate.

* * * * *